United States Patent
Jeong

(10) Patent No.: US 9,082,726 B2
(45) Date of Patent: Jul. 14, 2015

(54) ORGANIC LIGHT-EMITTING DISPLAY APPARATUS AND METHOD OF MANUFACTURING THEREOF

(71) Applicant: SAMSUNG DISPLAY CO., LTD., Yongin, Gyeonggi-Do (KR)

(72) Inventor: Ho-Young Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/898,282

(22) Filed: May 20, 2013

(65) Prior Publication Data

US 2014/0191204 A1 Jul. 10, 2014

(30) Foreign Application Priority Data

Jan. 7, 2013 (KR) .................. 10-2013-0001793

(51) Int. Cl.
H01L 27/32 (2006.01)
H01L 51/52 (2006.01)
H01L 51/56 (2006.01)

(52) U.S. Cl.
CPC .......... *H01L 27/322* (2013.01); *H01L 27/3246* (2013.01); *H01L 51/5246* (2013.01); *H01L 51/5253* (2013.01)

(58) Field of Classification Search
CPC .............. H01L 27/322; H01L 51/5284; H01L 27/3244; H01L 51/5237; H01L 27/3295; H01L 2924/12044; H01L 51/5246; H01L 51/56

USPC ........ 257/40, 59, 72, 88, 98, 100; 438/29, 34, 438/99
See application file for complete search history.

(56) References Cited

U.S. PATENT DOCUMENTS

| 7,030,556 | B2* | 4/2006 | Adachi et al. ................. 313/506 |
| 2007/0200492 | A1* | 8/2007 | Cok et al. ...................... 313/506 |
| 2007/0210706 | A1* | 9/2007 | Song et al. ..................... 313/506 |
| 2009/0236976 | A1* | 9/2009 | Lee ................................ 313/504 |
| 2011/0163340 | A1 | 7/2011 | Smith |
| 2011/0210348 | A1* | 9/2011 | Yuasa ............................. 257/88 |
| 2012/0097990 | A1 | 4/2012 | Koh et al. |

FOREIGN PATENT DOCUMENTS

KR 10-2011-0036011 4/2011
KR 10-2012-0043497 5/2012

* cited by examiner

*Primary Examiner* — Whitney T Moore
(74) *Attorney, Agent, or Firm* — Christie, Parker & Hale, LLP

(57) ABSTRACT

An organic light-emitting display apparatus includes: a display substrate; a plurality of organic light-emitting diodes (OLEDs) on the display substrate, the OLEDs being divided from one another by a pixel defining layer (PDL); an encapsulation substrate on the display substrate and covering the OLEDs; a filling material on the PDL and between the display substrate and the encapsulation substrate; and a cavity between the OLEDs and the encapsulation substrate.

15 Claims, 4 Drawing Sheets

ORGANIC LIGHT-EMITTING DISPLAY APPARATUS AND METHOD OF MANUFACTURING THEREOF

CROSS-REFERENCE TO RELATED PATENT APPLICATION

This application claims priority to and the benefit of Korean Patent Application No. 10-2013-0001793, filed on Jan. 7, 2013, in the Korean Intellectual Property Office, the disclosure of which is incorporated herein in its entirety by reference.

BACKGROUND

1. Field

Embodiments of the present invention relate to an organic light-emitting display apparatus and a method of manufacturing thereof, and more particularly, to an organic light-emitting display apparatus including a filling material and a method of manufacturing thereof.

2. Description of the Related Art

Generally, an organic light-emitting display apparatus includes an organic light-emitting diode (OLED) which includes a hole injection electrode, an electron injection electrode, and an organic emission layer formed between the hole injection electrode and the electron injection electrode. The organic light-emitting display apparatus is a self-light-emitting display apparatus that combines holes injected from the hole injection electrode with electrons injected from the electron injection electrode in the organic emission layer to generate excitons and that lowers the excitons from an exited state to a ground state to generate light.

The organic light-emitting display apparatus, being a self-light-emitting display apparatus, does not require an additional light source, and thus is driven at a low voltage and has a light and thin shape. Also, the organic light-emitting display apparatus has high-quality characteristics including a wide viewing angle, a high contrast, and a fast response speed and has received attention as a next generation display apparatus.

SUMMARY

Aspects of embodiments of the present invention are directed to an organic light-emitting display apparatus including a patterned filling material and a method of manufacturing thereof, by which an apparatus strength is improved, and a light loss is inhibited.

According to one embodiment, an organic light-emitting display apparatus includes: a display substrate; a plurality of organic light-emitting diodes (OLEDs) on the display substrate, the OLEDs being divided from one another by a pixel defining layer (PDL); an encapsulation substrate on the display substrate and covering the OLEDs; a filling material on the PDL and between the display substrate and the encapsulation substrate; and a cavity between the OLEDs and the encapsulation substrate.

The organic light-emitting display apparatus may further include a color filter between the OLEDs and the encapsulation substrate.

A wavelength of light passed by the color filter may correspond to a wavelength area of light emitted from an OLED of the OLEDs corresponding to the color filter.

The organic light-emitting display apparatus may further include a black matrix between the PDL and the encapsulation substrate.

The black matrix may include one of Cr, CrO, graphite, and C.

The cavity may be filled with air or nitrogen ($N_2$) gas.

The organic light-emitting display apparatus may further include a protective layer on the OLEDs.

The organic light-emitting display apparatus may further include a conductive layer between the filling material and the OLEDs to electrically contact a cathode electrode of the OLEDs, wherein the cathode electrode is between the PDL and the filling material.

The organic light-emitting display apparatus may further include an encapsulation material adhered to the display substrate and to the encapsulation substrate and enclosing the plurality of OLEDs.

The organic light-emitting display apparatus may further include an absorbent adjacent the plurality of OLEDs.

According to another aspect of the present disclosure, there is provided an organic light-emitting display apparatus including: a display substrate; a display on the display substrate and comprising a plurality of light-emission areas comprising a plurality of organic light emitting diodes (OLEDs) and a non-light-emission area between adjacent ones of the light-emission areas; an encapsulation substrate facing the display substrate; a filling material between the display substrate and the encapsulation substrate and disposed in the non-light-emission area; a color filter which is disposed in the light-emission areas; and a black matrix which is disposed in the non-light-emission area.

The non-light-emission area may protrude from the display substrate more than the light-emission areas protrude from the display substrate.

The filling material may not be in the light-emission areas.

The filling material may be an insulating material.

The organic light-emitting display apparatus may further include a conductive layer between the non-light-emission area and the filling material and electrically connected to cathode electrodes of the OLEDs.

The organic light-emitting display apparatus may further include a protective layer on the OLEDs.

According to another aspect of the present disclosure, there is provided a method of manufacturing an organic light-emitting display apparatus, the method including: forming a patterned filling material on a surface of an encapsulation substrate; forming a display on a surface of a display substrate; and adhering the display substrate to the encapsulation substrate so that the display and the patterned filling material face each other, the display substrate being adhered to the encapsulation substrate by an encapsulation material.

The display may include a light-emission area comprising an OLED and a non-light-emission area dividing the light-emission area into a plurality of regions. The patterned filling material may be disposed only in a part of the surface of the encapsulation substrate corresponding to the non-light-emission area.

The patterned filling material may be formed by molding.

The formation of the patterned filling material may include: coating a liquid filling material using a screen mask patterned on the encapsulation substrate; and hardening the liquid filling material.

The method may further include: coating the encapsulation material to enclose an edge of the filling material; and the display substrate and the encapsulation substrate may be adhered through an encapsulation material in a vacuum state.

The display may include a light-emission area in which an OLED is disposed and a non-light-emission area dividing the light-emission area into a plurality of regions. The method may further include: forming a color filter in a first area of the encapsulation substrate corresponding to the light-emission area; and forming a black matrix in a second area of the encapsulation substrate corresponding to the non-light-emission area.

The color filter may be formed on a lower surface of the encapsulation substrate, and the black matrix may be formed on an upper surface of the encapsulation substrate.

After the filling material is formed, the method may further include: forming a conductive layer on the filling material.

The method may further include: forming an absorbent between the encapsulation material and the filling material before the display substrate and the encapsulation substrate are adhered onto each other.

BRIEF DESCRIPTION OF THE DRAWINGS

The above and other features and aspects of the present disclosure will become more apparent by describing in detail exemplary embodiments thereof with reference to the attached drawings in which.

DETAILED DESCRIPTION

Figure 1A:
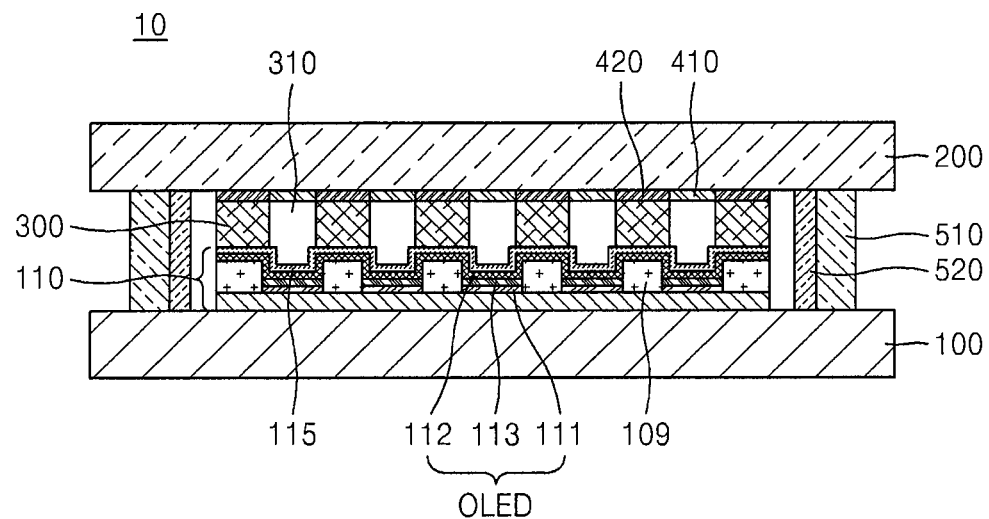
FIG. 1A is a schematic cross-sectional view illustrating an organic light-emitting display apparatus according to an exemplary embodiment of the present disclosure.

Embodiments of the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. It will be understood that, although the terms 'first', 'second', etc. may be used herein to describe various elements, these elements should not be limited by these terms. These terms are only used to distinguish one element from another.

If an exemplary embodiment is differently realized, a particular process order may be performed differently from a described order. For example, two consecutively described processes may be simultaneously or concurrently performed or may be performed in an opposite order to a described order.

Figure 1B:
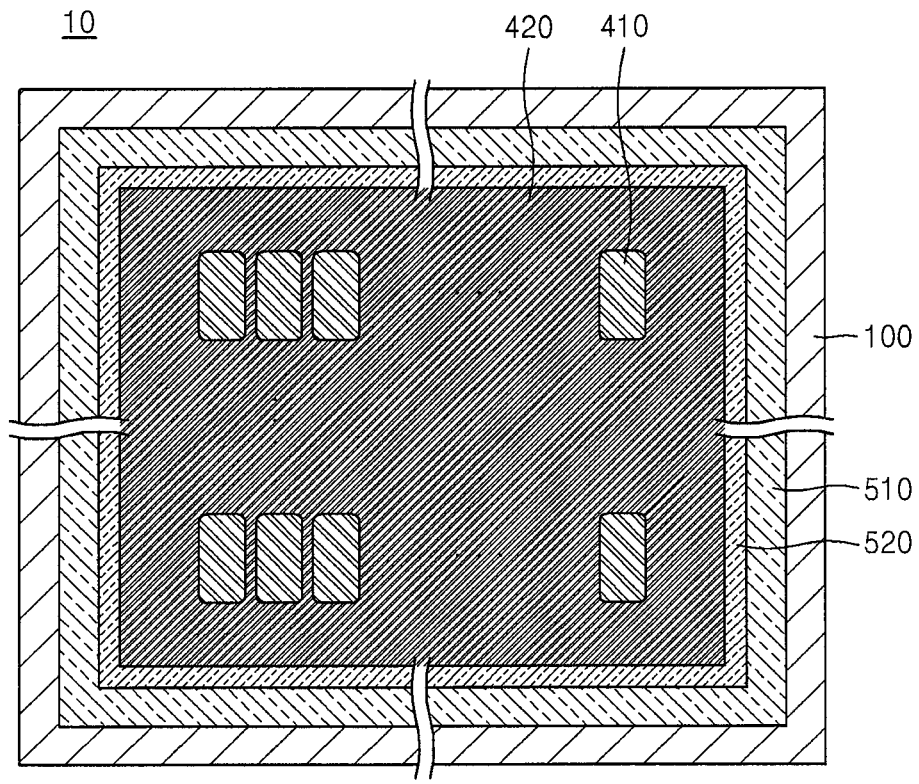
FIG. 1B is a schematic plan view illustrating the organic light-emitting display apparatus of the embodiment shown in FIG. 1A.
Figure 2:
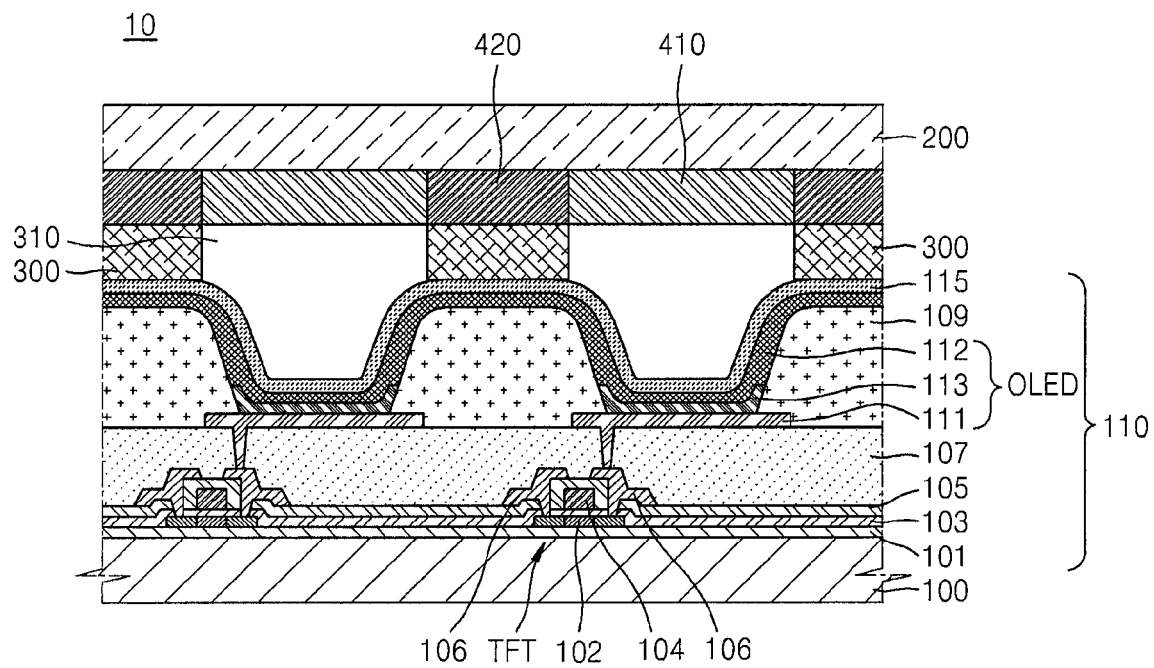
FIG. 2 is a schematic cross-sectional view illustrating a part of the organic light-emitting display apparatus of the embodiment shown in FIG. 1A.

FIG. 1A is a schematic cross-sectional view illustrating an organic light-emitting display apparatus 10 according to an exemplary embodiment of the present disclosure. FIG. 1B is a schematic plan view illustrating the organic light-emitting display apparatus 10 of the embodiment shown in FIG. 1A. FIG. 2 is a schematic cross-sectional view illustrating a part of the organic light-emitting display apparatus 10 of FIG. 1A.

Referring to FIGS. 1A, 1B, and 2, the organic light-emitting display apparatus 10 includes a display substrate 100, a display 110 which is disposed on the display substrate 100 and includes an organic light-emitting diode (OLED), an encapsulation substrate 200, and a filling material 300. The organic light-emitting display apparatus 10 further includes one of a protective layer 115 disposed on the OLED, a color filter 410, a black matrix 420, and an encapsulation material 510 or an absorbent 520 enclosing the display 110.

The display substrate 100 may be formed of a transparent glass material including $SiO_2$ as a main component. The display substrate 100 is not limited thereto and thus may be formed of a transparent plastic material. A plastic material forming the display substrate 100 may be an insulating organic material selected from the group consisting of polyestersulfone (PES), polyacrylate (PAR), polyetherimide (PEI), polyethylene napthalate (PEN), polyethylene terephthalate (PET), polyphenylene sulfide (PPS), polyarylate, polyimide, polycarbonate (PC), TAC, and cellulose acetate propionate (CAP)

If the organic light-emitting display apparatus 10 is a bottom emission type in which an image is realized toward the display substrate 100, the display substrate 100 may be formed of a transparent material. However, if the organic light-emitting display apparatus 10 is a top emission type in which the image is realized in an opposite direction to the display substrate 100, the display substrate 100 does not need to be formed of a transparent material and thus may be formed of a ceramic or metallic material. For example, the display substrate 100 may include one or more materials selected from the group consisting of carbon (C), iron (Fe), chrome (Cr), nickel (Ni), titanium (Ti), molybdenum (Mo), and stainless steel (SUS) but embodiments of the present invention are not limited thereto. The display substrate 100 may be a substrate formed of metal foil.

The protective layer 101, such as a barrier layer, a blocking layer, and/or a buffer layer, is disposed on an upper surface of the display substrate 100 to prevent (or impede) impurity ions from being diffused, to prevent (or impede) a penetration of moisture or air, and to planarize a surface. The protective layer 101 may be formed of, for example, $SiO_2$, $SiN_x$, and/or $SiO_xN_y$. The protective layer 101 may be deposited according to various deposition methods such as a plasma enhanced chemical vapor deposition (PECVD), an atmospheric pressure CVD (APCVD), a low pressure CVD (LPCVD), etc. In some embodiments, the protective layer 101 is omitted.

The display 110 is disposed on the upper surface of the display substrate 100 and includes a thin film transistor (TFT) and the OLED. In FIG. 2, each pixel includes one TFT, but this is for the descriptive convenience. Embodiments of the present invention are not limited thereto, and thus each pixel may include a plurality of TFTs and a storage capacitor The TFTs are electrically connected to the OLED to drive the OLED. The TFT shown in FIG. 2 is a top gate type and includes (or sequentially includes) an active layer 102, a gate electrode 104, a source electrode 106, and a drain electrode 108. The top gate type TFT is disclosed in the present exemplary embodiment, but embodiments of the present invention are not limited to the shape of the TFT shown in the drawings and may use various types of TFTs.

A silicon, inorganic semiconductor such as an oxide semiconductor or the like, or an organic semiconductor may be formed and patterned on an entire surface of the display substrate 100 on the protective layer 101 to form the active layer 102.

According to an exemplary embodiment, the active layer 102 may be formed of silicon. In this case, an amorphous silicon layer may be formed on the entire surface of the display substrate 100 and then crystallized to form a polycrystalline silicon layer. Also, the polycrystalline silicon layer may be patterned, impurities may be doped into source and drain areas to form the active layer 102 including the source area, the drain area, and a channel area formed between the source and drain areas.

According to another exemplary embodiment, the active layer 102 may be formed of oxide semiconductor. For example, the oxide semiconductor may include an oxide of a material selected from 12-group, 13-group, and 14-group metallic elements such as Zn, In, Ga, Sn, Cd, Ge, and Hf, and combinations thereof.

Source and/or drain areas are formed at both (e.g., opposite) edges of the active layer 102 and are respectively electrically connected to source and drain electrodes 106 and 108. A gate insulating layer 103 is formed on the active layer 102, and a gate electrode 104 is formed in an area (e.g., a predetermined area) of an upper surface of the gate insulating layer 103. The gate electrode 104 is connected to a gate line which applies on/off signals of the TFT.

An interlayer insulating layer 105 is formed on the gate electrode 104, and the source and drain electrodes 106 and 108 are formed to respectively contact the source and drain areas of the active layer 102 through contact holes.

The gate insulating layer 103 and the interlayer insulating layer 105 may be insulators. For example, the gate insulating layer 103 and the interlayer insulating layer 105 may be formed of inorganic materials, organic materials, or organic/inorganic compounds in single layer structures or multilayer structures. According to an exemplary embodiment, the gate insulating layer 103 and the interlayer insulating layer 105 may include $SiN_x$, or $SiO_2$.

A planar layer (or planarization layer) 107 covers and protects the TFT, and/or removes a step difference and performs planarizing to improve light-emitting efficiency of the OLED to be formed on the planar layer 107. The planar layer 107 may be an inorganic insulating layer and/or an organic insulating layer. The inorganic insulating layer may include $SiO_2$, SiNx, SiON, $Al_2O_3$, $TiO_2$, $Ta_2O_5$, $HfO_2$, $ZrO_2$, BST, PZT, or the like. The organic insulating layer may include general-purpose polymer (PMMA, PS), a polymer derivative having phenol polymer, acrylic polymer, amide polymer, aryl ether polymer, amide polymer, fluoric polymer, p-xylene polymer, vinyl alcohol polymer, or a blend (or combination) thereof. The planar player 107 may be formed in a compound stack structure of an inorganic insulating layer and an organic insulating layer.

The OLED is disposed in a light-emission area above the planar layer 107. The light-emission area and a non-light-emission area will be described later along with a pixel defining layer (PDL) 109.

The OLED includes an anode electrode 111 connected to one of the source and drain electrodes 106 and 108 of the TFT, a cathode electrode 112 facing the anode electrode 111, and an organic emission layer 113 interposed between the anode electrode 111 and the cathode electrode 112.

The anode electrode 111 of the OLED is formed on the planar layer 107, and the PDL 109 is formed as an insulating material covering the anode electrode 111. The PDL 109 may include a resin such as polyacrylates, polyimides, benzocyclobutene, or phenol and a silica-based inorganic material. According to an exemplary embodiment, the PDL 109 may be formed by using a spin coating method.

An opening (e.g. a predetermined opening) exposing a central part of the anode electrode 111 is formed in the PDL 109, and the organic emission layer 113 of the OLED is formed in an area defined through the opening (or the predetermined opening). The cathode electrode 112 of the OLED is formed to cover all pixels.

Sub pixels are defined by the opening of the PDL 109, and one OLED is disposed in each sub pixel. In other words, a light-emission area is formed in the opening of the PDL 109 due to the organic emission layer 113 and is divided into regions by the PDL 109. The PDL 109 may be defined as a non-light-emission area.

The anode electrode 111 may be a transparent electrode or a reflective electrode. If the anode electrode 111 is the transparent electrode, the anode electrode 111 may be formed of ITO, IZO, ZnO, or $In_2O_3$. If the anode electrode 111 is the reflective electrode, the anode electrode 111 may include a reflective layer formed of Ag, Mg, Al, Pt, Pd, Au, Ni, Nd, Ir, Cr, or a combination thereof and a transparent layer formed of ITO, IZO, ZnO, or $In_2O_3$. According to an exemplary embodiment, the anode electrode 111 may be a reflective electrode having a structure of ITO/Ag/ITO.

The cathode electrode 112 may be a transparent electrode or a reflective electrode. If the cathode electrode 112 is the transparent electrode, the cathode electrode 112 may include a layer formed by depositing Li, Ca, LiF/Ca, LiF/Al, Al, Mg, or a combination thereof to face (e.g., on a surface facing) the organic emission layer 113 and an auxiliary electrode or a bus electrode line formed of a transparent conductive material such as ITO, IZO, ZnO, $In_2O_3$, or the like. If the cathode electrode 112 is the reflective electrode, the cathode electrode 112 may be formed of Li, Ca, LiF/Ca, LiF/Al, Al, Mg, or a combination thereof. According to one embodiment, the anode electrode 111 and the cathode electrode 112 may be exchanged with each other.

The organic emission layer 113 interposed between the anode electrode 111 and the cathode electrode 112 may be formed of a low or high molecular organic material. If the organic emission layer 113 is formed of the low molecular material, a hole injection layer (HIL), a hole transport layer (HTL), an electron transport layer (ETL), an electron injection layer (EIL), etc. may be stacked in a single or compound structure, so that the organic emission layer 113 is positioned therebetween. Various types of organic materials, such as copper phthalocyanine (CuPc), N,N'-di(naphthalene-1-yl)-N,N'-diphenyl-benzidine (NPB), tris-8-hydroxyquinoline aluminum (Alq3), etc., may be used for the organic emission layer 113. These low molecular organic materials may be formed through a vacuum deposition method by using masks.

If the organic emission layer 113 is formed of the high molecular organic material, the organic emission layer 113 may have a structure in which a HTL is further included in a direction extending from the organic emission layer 113 toward the anode electrode 111 (e.g., between the organic emission layer 113 and the anode electrode 111). Here, the HTL may be formed of PEDOT, and the emission layer may be formed of a Poly-Phenylenevinylene (PPV) or polyfluorene-based high molecular organic material. The organic emission layer 113 may emit light of one of red, green, blue, and white colors (or red, green, blue, or white light).

According to one embodiment, the organic emission layer 113 is disposed only in the opening of the PDL 109 in FIG. 2, but embodiments of the present invention are not limited thereto. For example, the organic emission layer 113 may be formed on the anode electrode 111 in the opening of the PDL 109 or may be disposed between the PDL 109 and the cathode electrode 112.

The protective layer 115 is formed on the cathode electrode 112 of the OLED. The protective layer 115 covers and protects the OLED. The protective layer 115 may be an inorganic insulating layer and/or an organic insulating layer. The inorganic insulating layer may be formed of $SiO_2$, $SiN_x$, SiON, $Al_2O_3$, $TiO_2$, $Ta_2O_5$, $HfO_2$, $ZrO_2$, BST, PZT, or the like. The organic insulating layer may include general-purpose polymer (PMMA, PS), a polymer derivative having phenol polymer, acrylic polymer, amide polymer, aryl ether polymer, amide polymer, fluoric polymer, p-xylene polymer, vinyl alcohol polymer, or a blend thereof. The protective layer 115 may be deposited by using various deposition methods such as PECVD, APCVD, LPCVD, etc. In some embodiments, the protective layer 115 is omitted.

In the above-described exemplary embodiment, the organic emission layer 113 is formed in the opening to form an additional light-emission material in each sub pixel, but embodiments of the present invention are not limited thereto. For example, the organic emission layer 113 may be commonly formed on an entire surface of the planar layer 107 regardless of a position of a pixel. In this embodiment, layers including light-emitting materials emitting red, green, blue lights may be vertically stacked or mixed to form the organic emission layer 113. If the organic light-emitting layer is capable of emitting a white light, different colors may also be combined. Additionally, a color conversion layer for converting the emitted white light into a particular color (e.g., a predetermined color), or a color filter may be further included.

The term "display 110" as used herein includes the TFT and the OLED formed on the display substrate 100. Therefore, the display 110 includes a plurality of light-emission areas in which the OLED is disposed and a non-light-emission area which is the PDL 109 dividing the plurality of light-emission areas.

The encapsulation substrate 200 faces the display substrate 100. The encapsulation substrate 200 protects the display 100, including the OLED, from external moisture, air, etc. The encapsulation substrate 200 may be formed of a glass material, a substrate formed of various types of plastic materials such as acryl, or a metal plate. A polaroid film or a color conversion layer may be further formed on the encapsulation substrate 200.

The filling material 300 is formed between the display substrate 100 and the encapsulation substrate 200 and is disposed above (or on) the PDL 109 to face the PDL 109. In other words, the filling material 300 is disposed above the PDL 109 in a region defined as the non-light-emission area to face the PDL 109. In this embodiment, filling material 300 is not be disposed above the light-emission area defined by the OLED. However, embodiments of the present invention are not limited thereto, and thus a part of the filling material 300 may be disposed on the OLED. According to an exemplary embodiment, the filling material 300 is patterned so that only a part of the filling material 300 corresponding to the non-light-emission area remains after patterning. Referring to FIG. 1A, the filling material 300 may be patterned in a mesh form on the encapsulation substrate 200 to enclose the light-emission area (or each of the light emission-areas).

The filling material 300 protects the display 110 from shocks applied from an external source. The filling material 300 may be an insulating material. According to an exemplary embodiment, the filling material 300 may be formed of a urethane resin, an epoxy resin, or an acrylic resin such an organic sealant, or an inorganic sealant. The urethane resin may be urethane acrylate or the like. The acrylic resin may be butyl acrylate, ethylhexyl acrylate, or the like. According to an exemplary embodiment, the filling material 300 may be polyimide.

A cavity 310 is formed on the OLED to face the OLED. According to an exemplary embodiment, the cavity 310 is filled with air or nitrogen ($N_2$) gas. According to another exemplary embodiment, the cavity 310 may be vacuum.

According to one embodiment, the color filter 410 is formed on the OLED to face the OLED and thus improves a visibility, e.g., ambient contrast ratio (ACR). In the embodiments depicted in the drawings, the color filter 410 is illustrated as being disposed on a lower surface of the encapsulation substrate 200 (e.g., a surface of the encapsulation substrate 200 facing toward the display 110) but embodiments are not limited thereto. For example, the color filter 410 may be disposed on an upper surface of the encapsulation substrate 200 (e.g., a surface of the encapsulation substrate 200 facing away from the display 110) or may directly contact the OLED.

The color filter 410 extracts light corresponding to a particular color (e.g., a predetermined color from light emitted from the organic emission layer 113. The color filter 410 may realize various colors according to corresponding OLEDs. According to an exemplary embodiment, the color filter 410 may realize one of red, green, and blue colors. According to an exemplary embodiment, the color filter 410 may realize a color in a wavelength area emitted from the corresponding OLED. For example, the color filter 410 realizing blue may be formed on (or over) an OLED emitting blue light. However, embodiments of the present invention are not limited thereto. For example, if the OLED emits white light, the color filter 410 may realize various colors.

In one embodiment, the black matrix 420 is disposed above the PDL 109 to face the PDL 109. In other words, the black matrix 420 may be disposed in the non-light-emission area to face the non-light-emission area. In the embodiments shown in the drawings, the black matrix 420 is illustrated as being disposed on the lower surface of the encapsulation substrate 200 but embodiments of the present invention are not limited thereto. For example, the black matrix 420 may be disposed on the upper surface of the encapsulation substrate 200. In another embodiment, the black matrix 420 is disposed on a different layer from that on the color filter 410 is disposed.

The black matrix 420 absorbs visible rays incident from an external source and prevents or attenuates colors of the visible rays emitted from the color filter 410 from mixing and interfering to improve a contrast of the organic light-emitting display apparatus 10. The black matrix 420 may be formed of a material suitable for absorbing visible light rays. According to an exemplary embodiment, the black matrix 420 may be formed of Cr, $CrO_x$, $Cr/CrO_x$, $Cr/CrO_x/CrN_y$, a resin (a carbon pigment, a RGB mixture pigment), graphite, non-chromium containing compounds (NonCr), or the like. A black material may be coated to have a pattern (e.g., a predetermined pattern), and a photolithographic process may be performed with respect to the black material to form the black matrix 420. However, the black matrix 420 according to embodiments of the present invention is not limited thereto and thus may be formed according to various other types of processes such as printing using a roller, etc.

According to one embodiment, the encapsulation material 510 encapsulates the display 110 and contacts the display substrate 100. The encapsulation material 510 protects the display 110, including the OLED, from external moisture, air, or the like. The encapsulation material 510 may be a material such as sealing, glass, frit, or the like.

The absorbent 520 may be disposed on a side of the display 110. The absorbent 520 easily reacts with moisture and oxygen to prevent or protect the lifespans of the OLED and other components of the display 110 from being reduced due to moisture and oxygen. The absorbent 520 may be one of alkali metal oxide, alkaline-earth metal oxide, metal halide, lithium sulfate, metal sulfate, metal perchlorate, silica gel, and phosphorous pentoxide, or a mixture thereof. In embodiments of the present invention, a type and a disposition position of the absorbent are not limited to the above description.

In an organic light-emitting display apparatus 10 according to one embodiment, the filling material 300 is not disposed on the OLED (which is the light-emission area) or a small part of the filling material 300 may be disposed on the OLED. Therefore, a light loss caused by the filling material 300 may be prevented or reduced, and dim spots may be prevented from occurring or reduced. According to one embodiment, the organic light-emitting display apparatus 10 includes the color filter 410 and/or the black matrix 420 to improve light extraction efficiency and color sharpness.

In the light-emission area of the organic light-emitting display apparatus 10, the cavity 310 is formed on the OLED to protect or to prevent particles from damaging the OLED.

Figure 3:
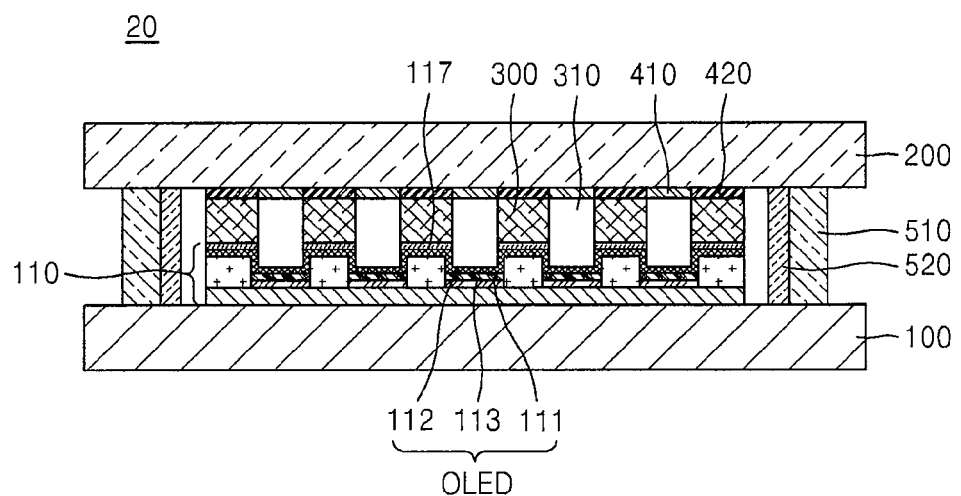
FIG. 3 is a schematic cross-sectional view illustrating an organic light-emitting display apparatus according to another exemplary embodiment of the present disclosure.

FIG. 3 is a schematic cross-sectional view illustrating an organic light-emitting display apparatus 20 according to another embodiment of the present invention. The same or similar reference numerals of FIG. 3 as those of FIG. 1 denote the same or similar elements, and thus their descriptions will be omitted for the sake of clarity.

Referring to FIG. 3, in comparison with the organic light-emitting display apparatus 10 of FIG. 1, the organic light-emitting display apparatus 20 further includes a conductive layer 117 formed between a non-light-emission area and a filling material 300. The conductive layer 117 is electrically connected to a cathode electrode 112 of a display 110 to lower a resistance of the cathode electrode 112 and to prevent or reduce a voltage drop. The conductive layer 117 is formed only in a non-light-emission area in FIG. 3 but embodiments of the present invention are not limited thereto. For example, the conductive layer 117 may be electrically connected to the cathode electrode 112 of a light-emission area. The conductive layer 117 may be formed of Li, Ca, LiF/Ca, LiF/Al, Al, Mg, Ag, or the like. According to an exemplary embodiment, the conductive layer 117 may be formed on the filling material 300. The filling material 300 may be formed on the encapsulation substrate 200, and then the conductive layer 117 may be formed on the filling material 300. The conductive layer 117 may be formed by using various deposition methods.

FIGS. 4A, 4B, 4C, 4D, and 4E are cross-sectional views illustrating a method of manufacturing the organic light-emitting display apparatus 10 of FIG. 1A, according to an exemplary embodiment of the present invention.

Figure 4A:
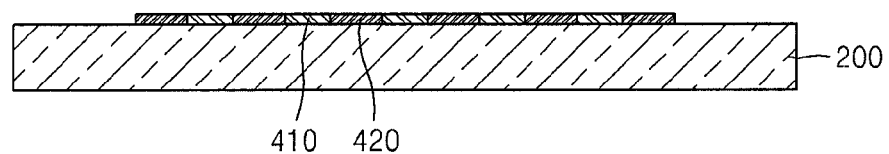
FIGS. 4A through 4E are cross-sectional views illustrating a method of manufacturing the organic light-emitting display apparatus of FIG. 1, according to an exemplary embodiment of the present disclosure.

Referring to FIG. 4A, the color filter 410 and the black matrix 420 are formed on the encapsulation substrate 200. The color filter 410 and the black matrix 420 are formed on the same layer in FIGS. 4A, 4B, 4C, 4D, and 4E but may be formed on different layers. For example, the color filter 410 may be formed, a protective layer may be formed on the color filter 410, and the black matrix 420 may be formed on the protective layer. According to another example, the color filter 410 may be formed on a lower surface of the encapsulation substrate 200, and the black matrix 420 may be formed on an upper surface of the encapsulation substrate 200. The color filter 410 may be formed through various methods such as a laser thermal transfer method, etc. A black material may be coated to have a particular pattern (e.g., a predetermined pattern), and a photolithographic process may be performed with respect to the black material to form the black matrix 420.

Figure 4B:
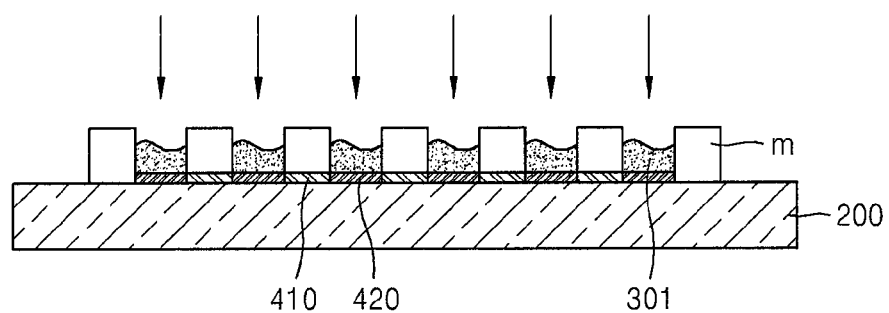
Figure 4C:
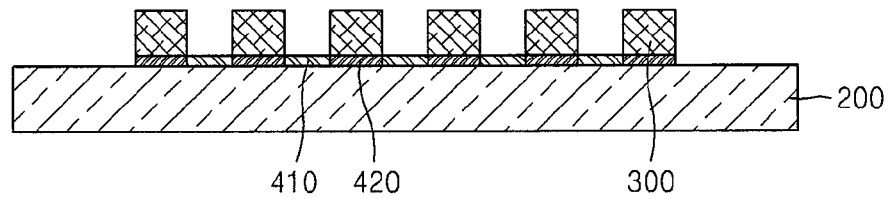

Referring to FIGS. 4B and 4C, a part to be formed as a light-emission area is covered by using a screen mask m, and a liquid filling material 301 is coated on a part corresponding to the black matrix 420. The liquid filling material 301 may be liquid silicon, polyimide, or the like and may be in a fluidic state. Because the liquid filling material 301 is fluid, the liquid filling material 301 has high smoothness to reduce defects caused by step differences.

The liquid filling material 301 may be coated by a particular amount (e.g., a predetermined amount), the screen mask m may be removed, and the liquid filling material 301 may be hardened to form a solid filling material 300. According to an exemplary embodiment, the liquid filling material 301 may be hardened to form the solid filling material 300 and then to remove the screen mask m. In FIGS. 4B and 4C, the liquid filling material 301 is coated by using the screen mask m. However, in other embodiments the liquid filling material 301 may be coated on the entire encapsulation substrate 200, hardened as the solid filling material 300, and patterned. In some embodiments, the patterned filling material 300 may be formed by molding.

Figure 4D:
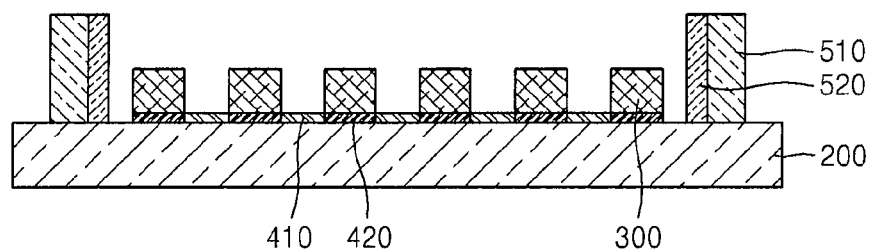

Referring to FIG. 4D, the absorbent 520 and the encapsulation material 510 are formed to enclose the filling material 300. Here, the liquid absorbent 520 may be formed by using a coating method or a liquid or paste encapsulation material 510 may be coated to form the absorbent 520.

Figure 4E:
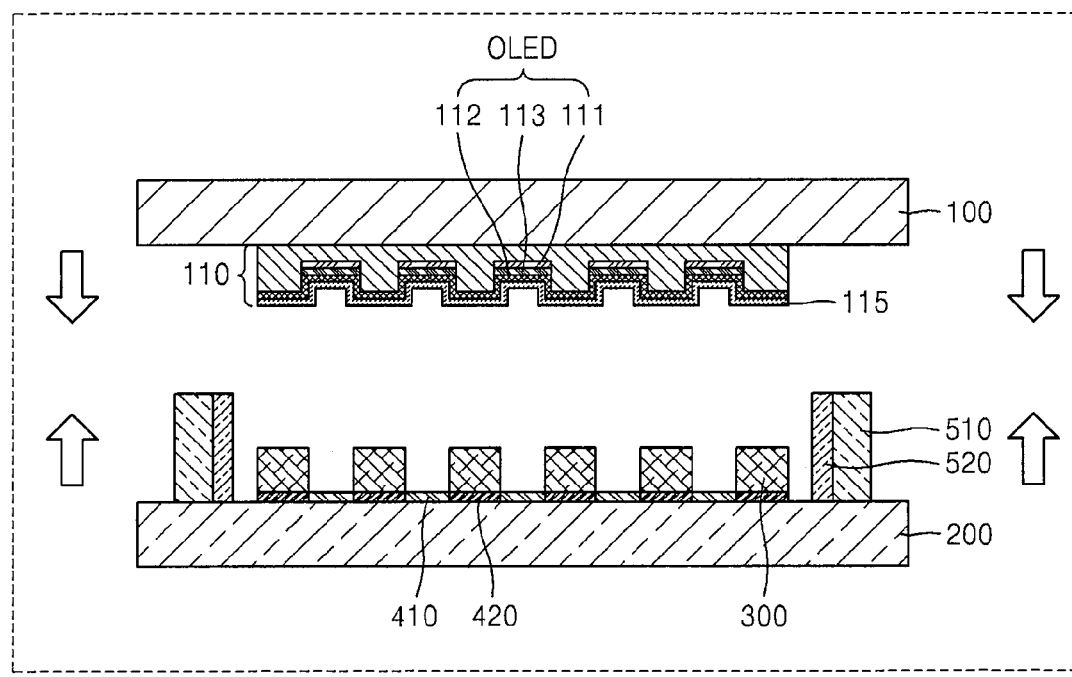

Referring to FIG. 4E, the display substrate 100 on which the display 110 including the TFT and the OLED is formed is adhered onto the encapsulation substrate 200. Here, the display substrate 100 and the encapsulation substrate 200 are disposed so that the display 110 and the filling material 300 face each other. According to an exemplary embodiment, the display substrate 100 and the encapsulation substrate 200 are adhered onto each other in a vacuum state. When the display substrate 100 and the encapsulation substrate 200 are adhered onto each other in the vacuum state, penetrations of external moisture and foreign matters can be reduced. The display substrate 100 and the encapsulation substrate 200 are adhered onto each other by the encapsulation material 510. According to an exemplary embodiment, ultraviolet rays are irradiated on the display substrate 100 and/or the encapsulation substrate 200 corresponding to the encapsulation material 510 to melt an interface between the display substrate 100 and/or the encapsulation substrate 200, thereby adhering (e.g., completely adhering) the display substrate 100 and/or the encapsulation substrate 200 onto each other. However, this is only an exemplary embodiment, and thus the display substrate 100 and the encapsulation substrate 200 may be adhered onto each other through various other suitable methods in accordance with a kind of the encapsulation material 510.

In the embodiments described above, the OLED is formed on the planar layer 107, but embodiments of the present invention are not limited thereto. Therefore, an OLED may be formed on a gate insulating layer or an interlayer insulating layer through a mask reducing process method.

As described above, an organic light-emitting display apparatus according to aspects of embodiments of the present invention includes a filling material formed in a non-light-emission area to improve an apparatus strength. Also, because the filling material is not formed in a light-emission area, the organic light-emitting-display apparatus prevents or reduces light emitted from the light-emission area from being attenuated by the filling material.

According to one embodiment, the organic light-emitting display apparatus does not include the filling material in the light-emission area and thus inhibits dim spots from occurring due to the filling material.

According to one embodiment, the organic light-emitting display apparatus includes a color filter and a black matrix to improve a color definition and a contrast.

While aspects of the present invention has been shown and described with reference to exemplary embodiments thereof, it will be understood by those of ordinary skill in the art that various changes in form and details may be made therein without departing from the spirit and scope of the present disclosure as defined by the following claims, and equivalents thereof.

What is claimed is:

1. An organic light-emitting display apparatus comprising:
    a display substrate;
    a plurality of organic light-emitting diodes (OLEDs) on the display substrate, the OLEDs being divided from one another by a pixel defining layer (PDL);
    an encapsulation substrate on the display substrate and covering the OLEDs;
    a black matrix between the PDL and the encapsulation substrate, the black matrix being on the encapsulation substrate;
    a filling material only on the PDL and between the display substrate and the encapsulation substrate, the filling material contacting the black matrix and the PDL; and
    a cavity between the OLEDs and the encapsulation substrate.

2. The organic light-emitting display apparatus of claim 1, further comprising a color filter between the OLEDs and the encapsulation substrate.

3. The organic light-emitting display apparatus of claim 2, wherein a wavelength of light passed by the color filter corresponds to a wavelength area of light emitted from an OLED of the OLEDs corresponding to the color filter.

4. The organic light-emitting display apparatus of claim 1, wherein the black matrix comprises one of Cr, CrO, graphite, and C.

5. The organic light-emitting display apparatus of claim 1, wherein the cavity is filled with air or nitrogen ($N_2$) gas.

6. The organic light-emitting display apparatus of claim 1, further comprising a protective layer on the OLEDs.

7. The organic light-emitting display apparatus of claim 1, further comprising a conductive layer between the filling material and the OLEDs to electrically contact a cathode electrode of the OLEDs,
    wherein the cathode electrode is between the PDL and the filling material.

8. The organic light-emitting display apparatus of claim 1, further comprising an encapsulation material adhered to the display substrate and to the encapsulation substrate and enclosing the plurality of OLEDs.

9. The organic light-emitting display apparatus of claim 1, further comprising an absorbent adjacent the plurality of OLEDs and contacting an encapsulation material.

10. An organic light-emitting display apparatus comprising:
    a display substrate;
    a display on the display substrate and comprising a plurality of light-emission areas comprising a plurality of organic light emitting diodes (OLEDs) and a non-light-emission area between adjacent ones of the light-emission areas;
    an encapsulation substrate facing the display substrate;
    a black matrix in the non-light-emission area, the black matrix being on the encapsulation substrate;
    a color filter in the light-emission areas; and
    a filling material between the display substrate and the encapsulation substrate and disposed only in the non-light-emission area, the filling material contacting the black matrix and the non-light-emission area of the display.

11. The organic light-emitting display apparatus of claim 10, wherein the non-light-emission area protrudes from the display substrate more than the light-emission areas protrude from the display substrate.

12. The organic light-emitting display apparatus of claim 10, wherein the filling material is an insulating material.

13. The organic light-emitting display apparatus of claim 10, further comprising a conductive layer between the non-light-emission area and the filling material and electrically connected to cathode electrodes of the OLEDs.

14. The organic light-emitting display apparatus of claim 10, further comprising a protective layer on the OLEDs.

15. The organic light-emitting display apparatus of claim 10, further comprising:
    an encapsulation material adhered to the display substrate and to the encapsulation substrate; and
    an absorbent adjacent the plurality of OLEDs and contacting the encapsulation material.

* * * * *